United States Patent
Chen

(12)
(10) Patent No.: US 6,343,013 B1
(45) Date of Patent: Jan. 29, 2002

(54) HEAT SINK ASSEMBLY

(75) Inventor: Chun-Chi Chen, Shenzhen (CN)

(73) Assignee: Foxconn Precision Components Co., Ltd., Taipie (TW)

(*) Notice: Subject to any disclaimer, the term of this patent is extended or adjusted under 35 U.S.C. 154(b) by 0 days.

(21) Appl. No.: 09/833,954

(22) Filed: Apr. 12, 2001

(51) Int. Cl.$^7$ ................................................. H05K 7/20
(52) U.S. Cl. .................. 361/695; 361/690; 361/697; 361/719; 257/718; 257/719; 257/726; 257/727; 174/16.1; 174/16.3; 165/80.3; 165/185
(58) Field of Search ................................. 361/690, 695, 361/704, 707, 717–719; 257/718, 719, 722, 726, 727; 174/16.1, 16.3; 165/80.2, 80.3, 185

(56) References Cited

U.S. PATENT DOCUMENTS 5,495,392 A * 2/1996 Shen ........................... 361/697
5,677,829 A * 10/1997 Clemens ..................... 361/697
5,724,228 A * 3/1998 Lee ............................ 361/697
5,841,633 A * 11/1998 Huang ........................ 361/695

* cited by examiner

*Primary Examiner*—Leo P. Picard
*Assistant Examiner*—Boris L. Chervinsky

(57) ABSTRACT

A heat sink assembly includes a heat sink (30), a fan (50), and a fixing device (10). The fixing device includes an engaging portion (12) for pressing the heat sink onto a CPU (40), and a fixing portion (14) for securing the fan to the heat sink. The engaging portion has a pressing section (122) and two spring sections (124) received in a slot (36) of the heat sink, and two legs (126). An aperture (130) is defined in each leg, for engaging with a corresponding catch (22) of a socket (20). The fixing portion has a frame (142), and four clamps (144) at four corners of the frame. Each clamp has a slit (148), and a pair of barbs (150) at a distal end of the clamp. Two integrating flanges (149) depend from opposite sides of the frame, each integrating flange integrally connecting with a corresponding leg.

19 Claims, 3 Drawing Sheets

HEAT SINK ASSEMBLY

BACKGROUND OF THE INVENTION

1. Field of the Invention

The present invention relates to a heat sink assembly, and more specifically to a heat sink assembly having a fixing device for readily securing a fan to a heat sink and pressing the heat sink onto a CPU.

2. Related Art

A conventional heat sink assembly for a CPU includes separate parts such as a heat sink, a heat sink clip, a fixing device and a fan. In assembly, the fan is mounted to the heat sink by the fixing device. Then the combined heat sink and fan is secured to a top surface of the CPU by means of the clip engaging with catches on a CPU socket or holes in a printed circuit board. The clip and the fixing device are separate parts which must be installed or removed separately. This is unduly time-consuming and costly.

Furthermore, the fan is frequently secured to the heat sink using a plurality of screws engaging with fins of the heat sink. The screws frequently distort or even damage the fins. Moreover, fins of contemporary heat sinks are often particularly thin, to maximize dissipation of great amounts of heat generated by contemporary CPUs. Thus it is becoming increasingly difficult to adequately secure a fan to a heat sink using screws.

An improved means of securing a fan to a heat sink which overcomes the above problems is desired.

BRIEF SUMMARY OF THE INVENTION

Accordingly, an object of the present invention is to provide a heat sink assembly having a fixing device which readily attaches a fan to a heat sink and presses the heat sink onto a CPU.

Another object of the present invention is to provide a heat sink assembly having a fixing device which is simply in structure and cost-efficient.

To achieve the above-mentioned objects, a heat sink assembly comprises a heat sink, a fan, and a fixing device. The fixing device comprises an engaging portion for pressing the heat sink onto a CPU, and a fixing portion for securing the fan to the heat sink. The engaging portion has a pressing section received in a slot of the heat sink, two spring sections at each side of the pressing section also received in the slot, and two legs depending from opposite ends of the spring sections. An aperture is defined in each leg, for engaging with a corresponding catch of a socket. The fixing portion has a frame, and four clamps in the vicinity of four corners of the frame. Each clamp has a slit, and a pair of barbs at a distal end of the clamp. A pair of integrating flanges depends from opposite sides of the frame, each integrating flange integrally connecting with a corresponding leg of the engaging portion.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
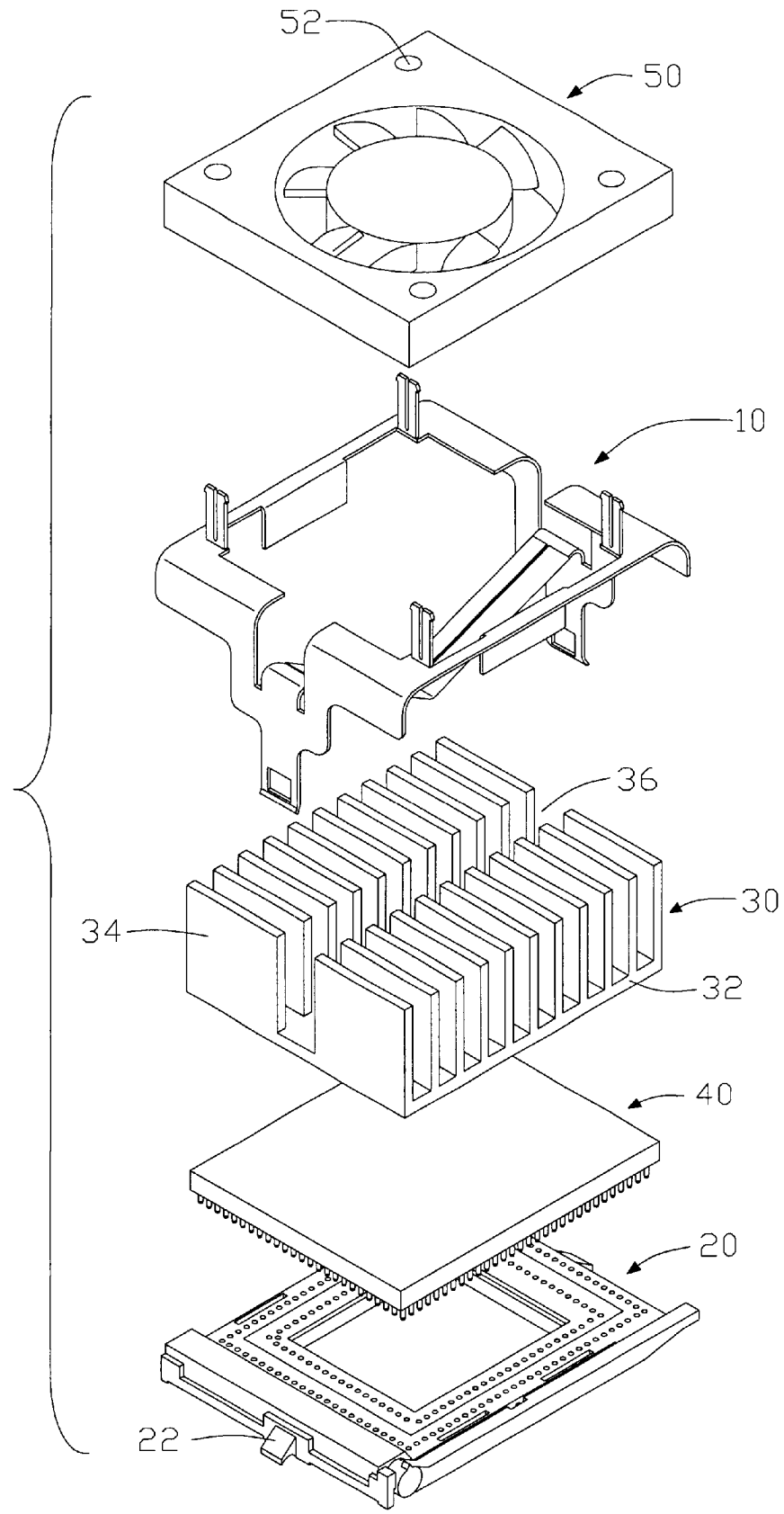
FIG. 1 is an exploded view of a heat sink assembly in accordance with the present invention, for mounting onto a CPU and a socket.

Referring to FIG. 1, a heat sink assembly in accordance with the present invention comprises a fan 50, a heat sink 30, and a fixing device 10. The fixing device 10 secures the fan 50 to the heat sink 30, and engages with a socket 20 to press the heat sink 30 onto a CPU 40.

The heat sink 30 comprises a base 32, and a plurality of parallel fins 34 extending upwardly from the base 32. A vertical slot 36 is defined through a middle portion of the fins 34, and perpendicular to the fins 34. The socket 20 forms a catch 22 at each of two opposite lateral sides thereof. The fan 50 defines a through hole 52 in the vicinity of each of four corers thereof.

Figure 2:
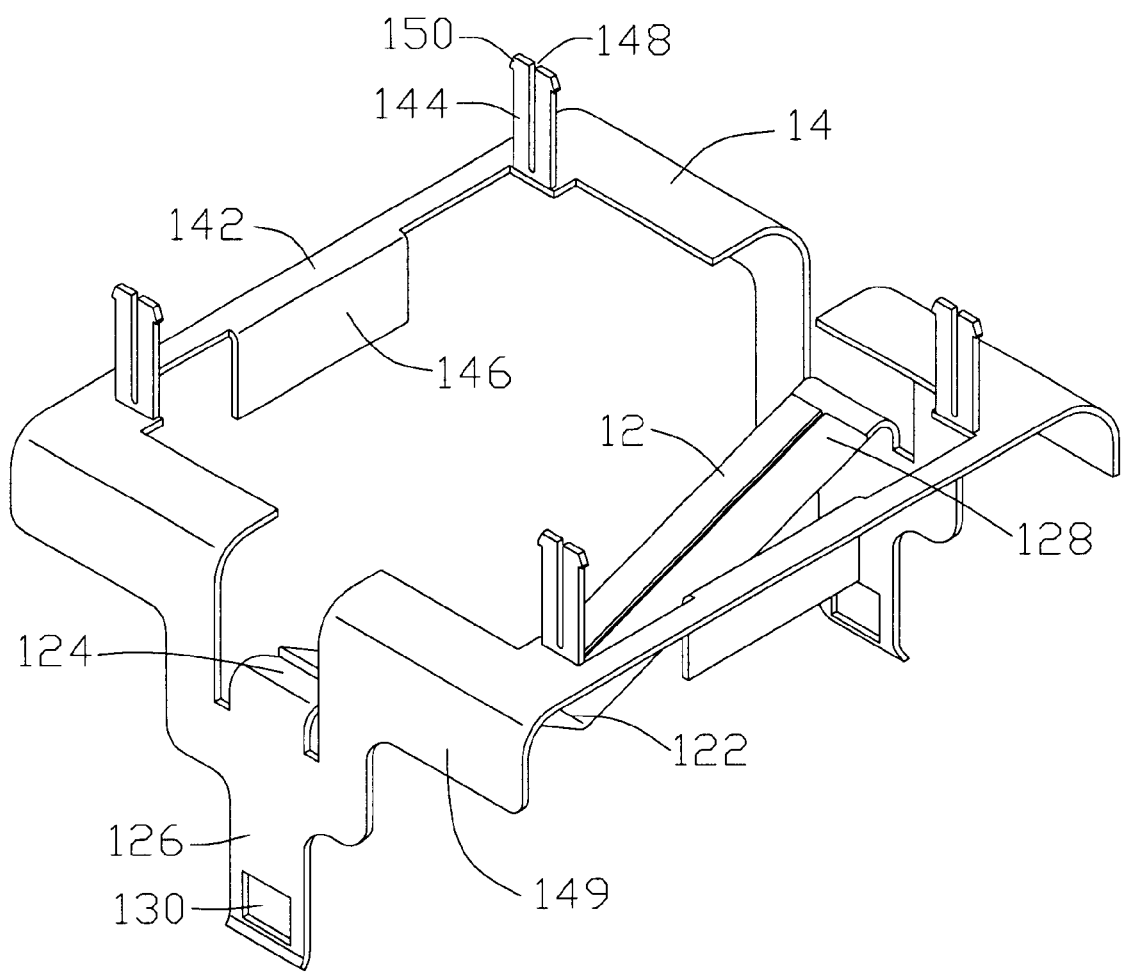
FIG. 2 is a perspective view of a fixing device of the heat sink assembly of FIG. 1.

Referring also to FIG. 2, the fixing device 10 is integrally made from a metal sheet. The fixing device 10 comprises an engaging portion 12 for pressing the heat sink 30 onto the CPU 40, and a fixing portion 14 above the engaging portion 12 for securing the fan 50 to the heat sink 30.

The engaging portion 12 comprises a pressing section 122, two spring sections 124 extending upwardly and outwardly from respective opposite sides of the pressing section 122, and two legs 126 depending from outer ends of the spring sections 124 respectively. A pair of folded flanges 128 is formed at opposite sides of the pressing section 122 and the spring sections 124, for reinforcing the pressing section 122 and the spring sections 124 and for increasing pressing force applied on the heat sink 30. An aperture 130 is defined in the vicinity of a distal end of each leg 126, for engaging with the corresponding catch 22 of the socket 20.

The fixing portion 14 has a rectangular frame 142 and four clamps 144 respectively extending upwardly from four corners of the frame 142. A pair of integrating flanges 149 respectively depends from opposite outer lateral edges of the frame 142. Each integrating flange 149 further extends downwardly at a middle portion thereof, thereby integrally connecting with the corresponding leg 126 of the engaging portion 12. A pair of plates 146 respectively depends from middle portions of opposite inner longitudinal edges of the frame 142. The clamps 144 respectively correspond to the four through holes 52 of the fan 50. A slit 148 is defined through a middle portion of each clamp 144. Each slit 148 effectively divides the clamp 144 into two halves, thereby providing deformation space for the clamp 144. A pair of barbs 150 is formed at a distal end of each clamp 144.

Figure 3:
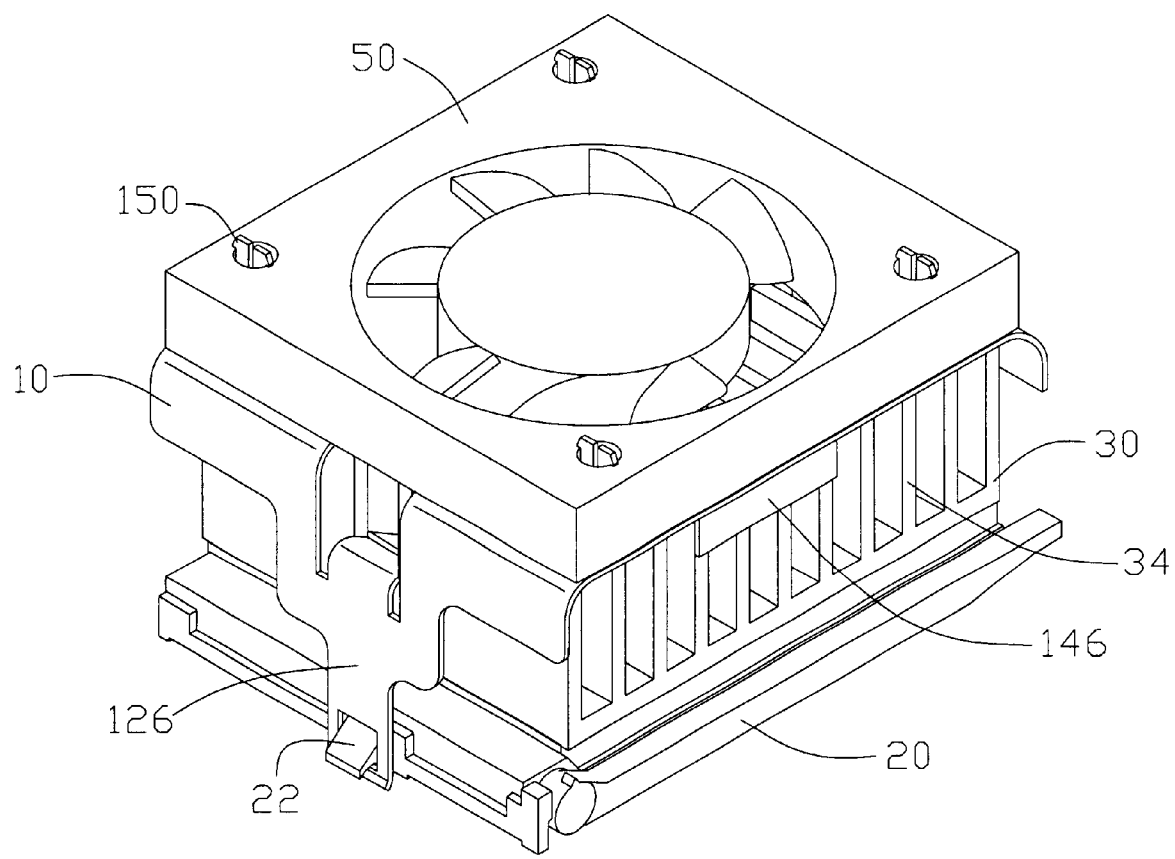
FIG. 3 is an assembled view of FIG. 1.

Referring also to FIG. 3, in assembly, the clamps 144 of the fixing device 10 are extended through the corresponding through holes 52 of the fan 50. The barbs 150 engage with an upper surface of the fan 50 at the through holes 52, thereby securing the fan 30 to an upper surface of the frame 142. The CPU 40 is mounted to the socket 20. The heat sink 30 is placed on the CPU 40. The combined fixing device 10 and fan 50 is placed on the heat sink 30, with the pressing section 122 and the spring portions 124 of the fixing device 10 accommodated in the slot 36 of the heat sink 30. The fan 50 is pressed downwardly, thereby forcing the engaging portion 12 at the apertures 130 to engage with the catches 22 of the socket 20. Thus, the pressing section 122 firmly presses the heat sink 30 against a top surface of the CPU 40. The plates 146 of the fixing device 10 respectively abut against opposite outmost ends of the fins 34 of heat sink 30, thus preventing lateral movement of the heat sink 30 relative to the CPU 40.

The fixing device 10 of the present invention integrally comprises the engaging portion 12 and the fixing portion 14.

The engaging portion 12 presses the heat sink 30 against the CPU 40, and the fixing portion 14 simultaneously secures the fan 50 to the heat sink 30. Thus the fixing device 10 is easily made at low cost, yet performs the said simultaneous functions of pressing and securing.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink assembly comprising:
   a heat sink having a base, a plurality of fins extending from the base, and
   a slot defined through the fins;
   a fan; and
   a fixing device comprising an engaging portion for pressing the heat sink onto an electronic device, and a fixing portion above the engaging portion for securing the fan to the heat sink, wherein the engaging portion has a pressing section received in the slot of the heat sink and engaging means to engage with a socket, and the fixing portion has a plurality of upwardly extending clamps for engaging with the fan.

2. The heat sink assembly as described in claim 1, wherein the engaging portion further comprises a plurality of spring sections extending upwardly and outwardly from the pressing section, and further comprises a plurality of legs, each leg defining an aperture for engagingly receiving a corresponding catch of the socket.

3. The heat sink assembly as described in claim 2, wherein a plurality of reinforcing folded flanges is formed at opposite edges of the pressing section and spring sections.

4. The heat sink assembly as described in claim 1, wherein the fixing portion has a frame, and the clamps extend upwardly from corners of the frame.

5. The heat sink assembly as described in claim 4, wherein a slit is defined in each clamp to effectively separate the clamp into two parts, and a pair of barbs is formed at a distal end of each clamp for engaging at a corresponding through hole of the fan.

6. The heat sink assembly as described in claim 4, wherein a pair of integrating flanges depends from opposite sides of the frame, each integrating flange integrally connecting with a corresponding leg of the engaging portion.

7. The heat sink assembly as described in claim 4, wherein a pair of plates depends from opposite sides of the frame, to prevent the heat sink from moving laterally.

8. A fixing device for attaching a fan to a heat sink and pressing the heat sink onto an electronic device, comprising:
   an engaging portion having a pressing section for pressing the heat sink onto the electronic device, two spring sections extending from the pressing section, and two legs depending from the spring sections for engaging with a socket; and
   a fixing portion having a frame and a plurality of clamps extending upwardly from corners of the frame, opposite sides of the frame having integrating flanges, each integrating flange integrally connecting with a corresponding leg of the engaging portion.

9. The fixing device as described in claim 8, wherein a pair of plates depends from opposite sides of the frame between the legs, for preventing the heat sink from moving laterally.

10. The fixing device as described in claim 8, wherein a slit is defined in each clamp to effectively separate the clamp into two parts, and a pair of barbs is formed at a distal end of each clamp.

11. The fixing device as described in claim 8, wherein an aperture is defined in the vicinity of a free end of each leg, for engagingly receiving a corresponding catch of the socket.

12. The fixing device as described in claim 8, wherein a pair of reinforcing folded flanges is formed at opposite edges of the pressing section and spring sections.

13. An electrical assembly, comprising:
   a rectangular socket forming two catches on opposite sides thereof,
   an electronic device mounted on the socket;
   a heat sink mounted on the socket, said heat sink having a plurality of upwardly extending fins defining a slot therethrough;
   a fixing device having a rectangular frame pressing against a top face of the fins, a plurality of clamps extending upwardly from the frame, two legs depending from opposite sides of the frame and engaging with the catches respectively, and an engaging portion formed between the two legs, received in the slot and pressing the heat sink toward the electronic device; and
   a fan mounted on the fixing device and engaging with the clamps of the fixing device.

14. The electrical assembly as described in claim 13, wherein the clamps are formed substantially at four corners of the frame.

15. The electrical assembly as described in claim 13, wherein two plates depend from opposite sides of the frame between the legs, and abut against ends of the fins.

16. The electrical assembly as described in claim 13, wherein the engaging portion comprises at least one folded flange.

17. The electrical assembly as described in claim 13, wherein the engaging portion comprises a downwardly pointing pressing section, and further comprises two spring sections extending from opposite sides of the pressing section, each spring section connecting a corresponding leg.

18. The electrical assembly as described in claim 13, wherein a pair of flanges depends from the opposite sides of the frame from which the legs extend, each flange being adjacent a corresponding leg.

19. The electrical assembly as described in claim 13, wherein each clamp has a central slit for providing deformation space and also has a pair of barbs at its free end.

* * * * *